(12) United States Patent
Kokubun (10) Patent No.: US 6,977,363 B2
(45) Date of Patent: Dec. 20, 2005

(54) CORRELATED DOUBLE SAMPLING CIRCUIT AND CMOS IMAGE SENSOR INCLUDING THE SAME

(75) Inventor: Masatoshi Kokubun, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/337,436

(22) Filed: Jan. 2, 2003

(65) Prior Publication Data

US 2003/0146369 A1 Aug. 7, 2003

(30) Foreign Application Priority Data

Feb. 7, 2002 (JP) .............................. 2002-030613

(51) Int. Cl.$^7$ ............................................ H01L 21/00
(52) U.S. Cl. ................... 250/208.1; 348/241
(58) Field of Search ................. 250/208.1, 214 A, 250/214 C; 348/308, 241

(56) References Cited

U.S. PATENT DOCUMENTS 6,326,603 B1 * 12/2001 Kuderer .................. 250/208.2

* cited by examiner

Primary Examiner—Thanh X. Luu
(74) Attorney, Agent, or Firm—Arent Fox PLLC (57) ABSTRACT

A correlated double sampling circuit that reduces a shift in the potential of a node on the reference voltage side produced by reset operation. A reset signal RST is turned to "H" and then is turned to "L." By doing so, a photodiode begins integration according to the intensity of light. This detected signal is sent to a CDS circuit. An SW1 and a connection switch for sampling in the CDS circuit are turned to ON to accumulate the detected signal according to integration time in C1 and C2 as electric charges. After a certain period of time elapsed, the SW1 and connection switch for sampling are turned to OFF to hold the detected signal sampled. Next, the RST is turned again to "H" and the SW1 is turned to ON. Then the RST is turned to "L" and the SW1 is turned to OFF. By doing so, reset noise is sampled and held in the C1. As a result, only a signal component can be extracted from the detected signal. After that a connection switch for outputting SW3 and a connection switch for reading are turned to ON to transfer an output voltage signal according to the signal component included in the detected signal to an output bus line.

8 Claims, 8 Drawing Sheets

SCHEMATIC VIEW OF LAYOUT

PRIOR ART
FIG. 7A

REFERENCE VOLTAGE SIGNAL LINE

PRIOR ART
FIG. 7B

CORRELATED DOUBLE SAMPLING CIRCUIT AND CMOS IMAGE SENSOR INCLUDING THE SAME

CROSS-REFERENCE TO RELATED APPLICATIONS

This application is based upon and claims priority of Japanese Patent Application No.2002-030613, filed on Feb. 7, 2002, the contents being incorporated herein by reference.

BACKGROUND OF THE INVENTION (1) Field of the Invention

This invention relates to a correlated double sampling circuit and a CMOS image sensor and, more particularly, to a correlated double sampling circuit for processing signals output from a pixel section where solid-state image sensing devices are arranged like a matrix and a CMOS image sensor including such a correlated double sampling circuit.

(2) Description of the Related Art

Solid-state image sensing devices used now for digital cameras, digital video cameras, and the like include image sensors using charge coupled devices (CCDs) and image sensors using complementary metal oxide semiconductor (CMOS) sensors. CMOS image sensors have merits. For example, CMOS image sensors consume a smaller amount of power than CCDs, CMOS image sensors can be driven by a single power source, and peripheral circuits, such as a timing generation circuit and read circuit, can be formed so that they will be one with CMOS image sensors. Therefore, CMOS image sensors have been used widely in recent years.

A CMOS image sensor comprises a pixel section where unit pixels including a photodiode are arranged like a matrix, a scanning circuit for scanning unit pixels in order, and a correlated double sampling (CDS) circuit for processing signals output from the pixel section.

Figure 5:
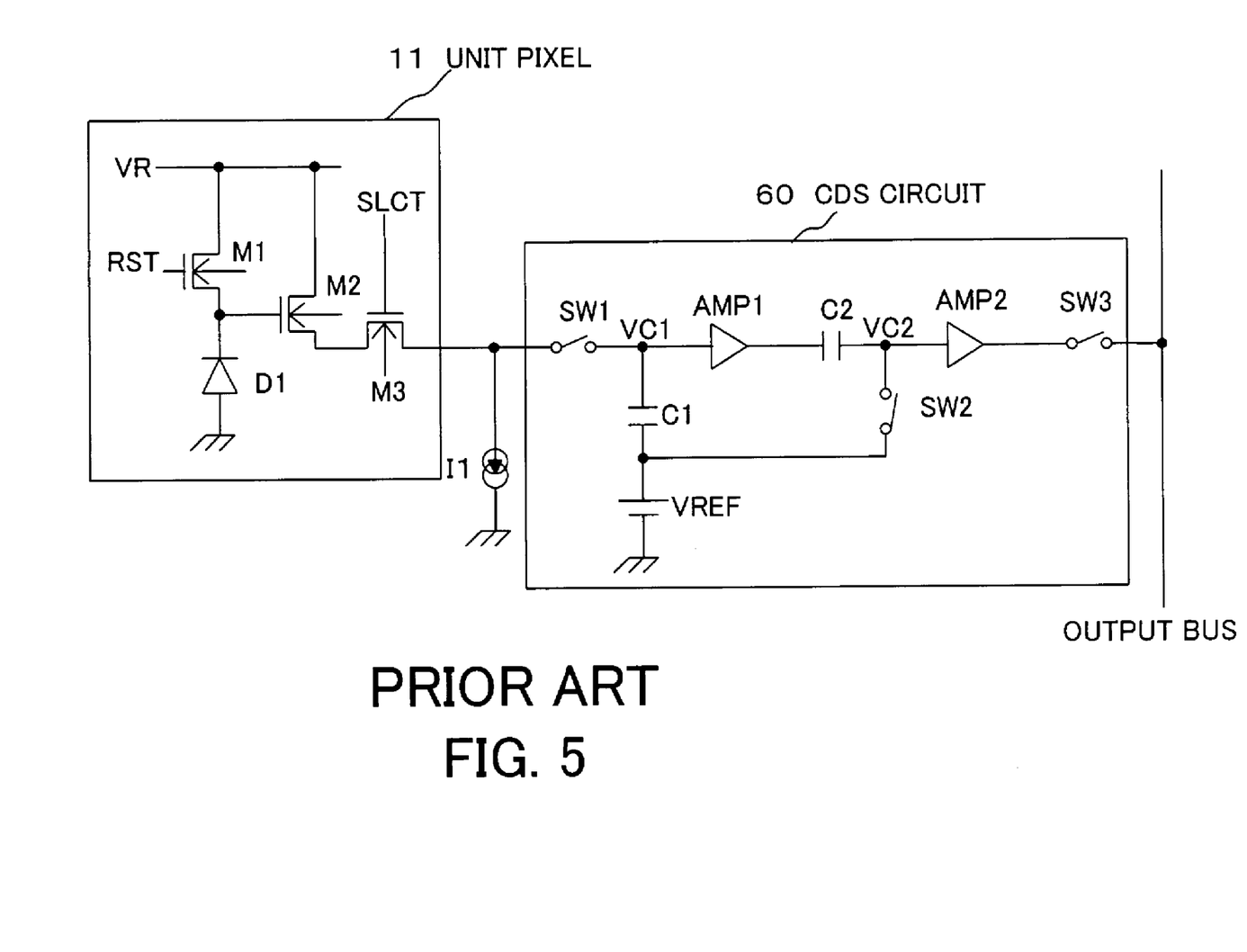
FIG. 5 is a circuit diagram of a unit pixel and CDS circuit.

This CDS circuit will now be described with reference to drawings. FIG. 5 is a circuit diagram of a unit pixel and CDS circuit.

A unit pixel 11 includes a photodiode D1, a reset transistor M1, a drive transistor M2, and a selection transistor M3. A plurality of unit pixels 11 each having the above structure are arranged like a matrix to form a pixel section. The pixel section is scanned in order by a vertical scanning shift register for scanning in a vertical direction and a horizontal scanning shift register for scanning in a horizontal direction.

There is a CDS circuit 60 for each column in the pixel section. The CDS circuit 60 processes a signal output from a unit pixel in a row selected by the vertical scanning shift register from among unit pixels in a column to which the CDS circuit 60 is connected. The CDS circuit 60 includes a first capacitor C1, a second capacitor C2, a power source VREF for generating reference potential Vref, amplifiers AMP1 and AMP2 for amplifying signals, a switch SW1, being a switching element, for controlling connection with the unit pixel 11, a switch SW2, being a switching element, for connecting one end of the second capacitor C2 to the first capacitor C1 and power source VREF, and a switch SW3, being a switching element, for outputting output signals to an output bus.

A current source I1 is located to make the transistor M2 in the unit pixel 11 function as an amplifier.

Figure 6:
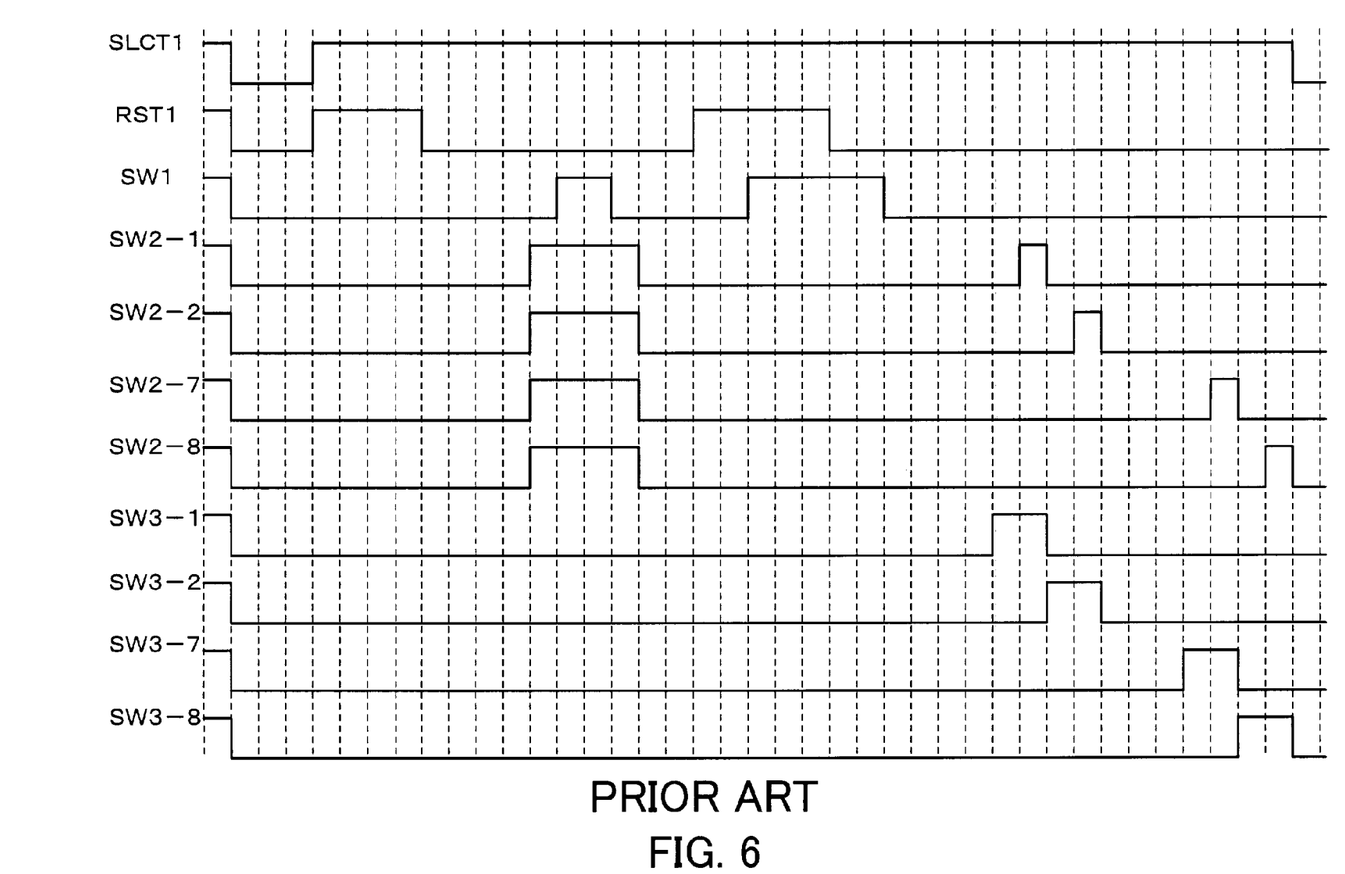
FIG. 6 is a timing chart of a CDS circuit.

Now, the operation of the above unit pixel and CDS circuit will be described. FIG. 6 is a timing chart of a CDS circuit.

First, a selection signal SLCT1 for selecting pixels in the first row is turned to ON by the vertical scanning shift register (the selection signal SLCT1 changes to the H level). Then a reset signal RST1 for resetting pixels in the first row is kept "H" for a certain period of time to perform the first reset called an initial reset. At this time the potential on the cathode side of the photodiode D1 is VR (constant). After the reset time ended, the reset signal RST1 is turned to "L." By doing so, the photodiode D1 begins integration according to the intensity of light. Then by turning the switch SW2 (it is assumed that there are eight columns of unit pixels and therefore switches SW2-1 through SW2-8) and switch SW1 in the CDS circuit 60 located for each column to ON, detected signals according to time during which the photodiode D1 integrates are accumulated as electric charges not only in the first capacitor C1 but also in the second capacitor C2. After a certain period of time elapsed, the switch SW1 and switches SW2-1 through SW2-8 are turned to OFF to hold the detected signals sampled. Subsequently, the reset signal RST1 is kept "H" for a certain period of time as the second reset and the switch SW1 is turned to ON during this time. By doing so, reset noise is accumulated in the first capacitor C1. After a predetermined period of time elapsed, the switch SW1 is turned to OFF. As a result, the potential at node VC2 of the second capacitor C2 is given by the following equation (1)

$$Vref-((detected\ signal+reset\ noise)-reset\ noise) \quad (1)$$

Therefore, only signal components can be extracted. After that the signals are transferred to the output bus line by turning the switch SW2 and switch SW3 in each CDS circuit (the switch SW2-1 and switch SW3-1, the switch SW2-2 and switch SW3-2, . . . , and the switch SW2-8 and switch SW3-8) to ON in synchronization with a scanning signal from the horizontal scanning shift register.

With conventional CDS circuits, however, a switching element for sampling detected signals is also used as a switching element for reading. Therefore, node potential on the reference voltage side, being reference, will shift at the time of the switch being turned to OFF, so that there will be differences in brightness among output images.

As described above, when detected signals according to time during which the photodiode D1 integrates are accumulated in the first capacitor C1 and second capacitor C2 as electric charges to sample the detected signals, the switches SW1 and SW2 in the CDS circuit 60 are turned to ON and are turned to OFF after a certain period of time. When the switch SW2 is turned to OFF, node potential on the reference voltage side, being reference, will shift by the influence of parasitic capacitance between the gate and source of a switching element, being the switch SW2, and between the gate and drain.

Figure 7A:
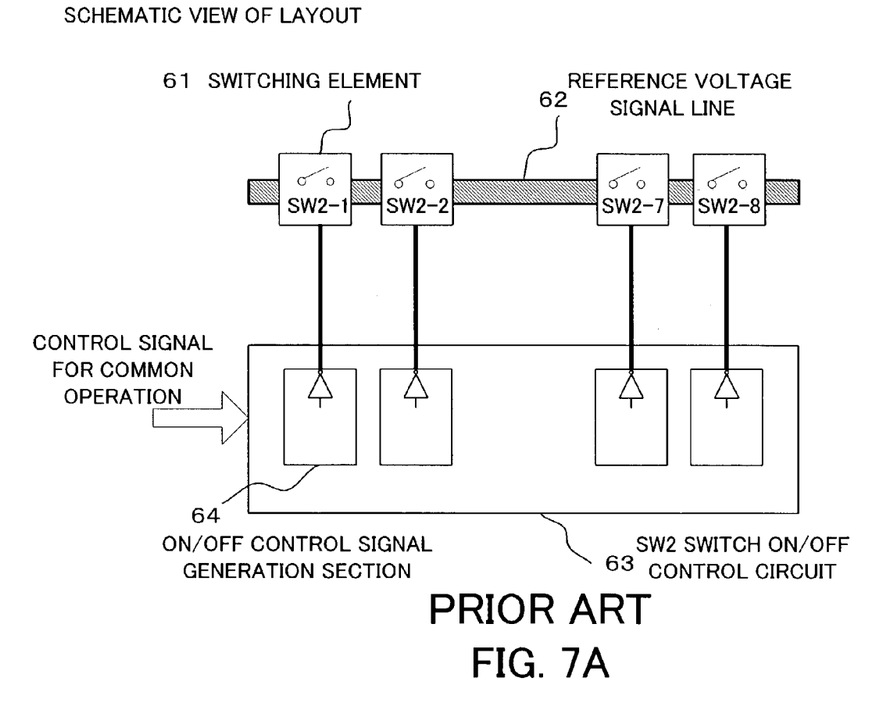
FIGS. 7A, B show a schematic of a layout and changes in reference voltage.
Figure 7B:
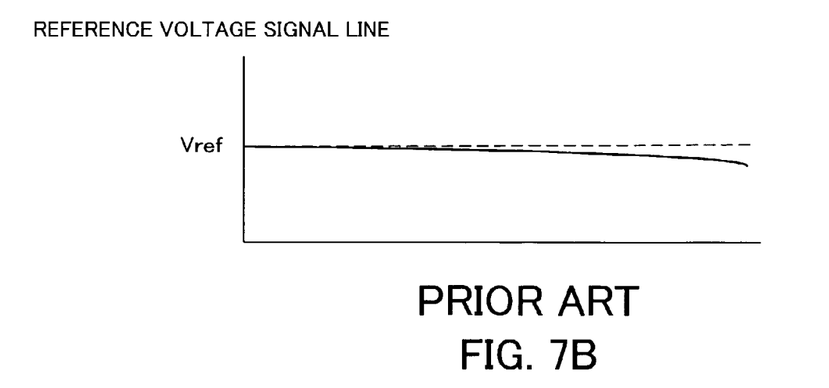

Moreover, there will be a shift in node potential caused by a layout. FIGS. 7A, B shows a schematic of a layout and changes in reference voltage. FIG. 7A is a schematic of a layout. FIG. 7B is a simple view showing changes in reference voltage corresponding to the switches SW2-1 through SW2-8.

In reference to FIG. 7A, the switch SW2 serving both as a switching element for sampling signals output from the unit pixel 11 and as a switching element for reading to the output bus is included in a CDS circuit located for each column. Switching elements 61 (SW2-1 through SW2-8, for example) are arranged in a row and are connected to a common reference voltage signal line 62. Each of the switching elements SW2-1 through SW2-8 is controlled by an SW2 switch on/off control circuit 63. When a control signal for common operation is input to the SW2 switch on/off control circuit 63, an on/off control signal generation section 64 corresponding to each switching element 61 generates a control signal. As a result, the switching elements SW2-1 through SW2-8 perform common operation. The switching elements SW2-1 through SW2-8 turn to ON/OFF in this way by a control signal for common operation, but in reality delays will occur. Therefore, when the SW2 turns to ON/OFF, reference voltage will fluctuate by the influence of the capacitance of a CDS circuit. If the SW2-1 through SW2-8 are turned to OFF in that order, a shift in reference voltage will gradually become great due to fluctuations in the reference voltage, the wiring resistance of the reference voltage signal line 62, and the like. It is assumed that a dashed line in FIG. 7B indicates ideal reference voltage (reference potential Vref). Then almost ideal reference voltage is obtained at the SW2-1, but reference voltage at the SW2-8 is lower than the ideal reference potential (Vref) by the influence of capacitance, wiring resistance, and the like. Such fluctuations in reference voltage will lead to a shift in the potential VC2 of a node on the reference voltage side. As a result, a shift in the number of electric charges accumulated in the second capacitor C2 will occur and differences in brightness will arise among results obtained when the CDS circuit 60 reads detected signals. It is assumed that pixels corresponding to the SW2-1 through SW2-8 output detected signals indicative of the same brightness. Then in the case of FIG. 7B, a pixel corresponding to the SW2-8 is duller than a pixel corresponding to the SW2-1. That is to say, a difference in brightness arises. A case where reference voltage at the SW2-8 is lower than the ideal reference potential (Vref) has been described. However, reference voltage at the SW2-8 may exceed the ideal reference potential (Vref), depending on how to control the switches. In this case, differences in brightness will also arise among the corresponding pixels.

Pixel sections have become minute, so the rate at which signals output from the pixel sections are read must be increased. Therefore, the width of a gate on the switching element SW2 used at read time must be widened to reduce its ON-state resistance. However, widening gate width will strengthen the influence of parasitic capacitance produced there and make a shift in the potential of a node on the reference voltage side great.

A shift in output signal caused by such a shift in the potential of a node on the reference voltage side is amplified by an amplifier located at the next stage of a CDS circuit. Therefore, even if a shift in signals output from a CDS circuit is small, differences in brightness will eventually arise among images. If an amplifier with an amplification factor of, for example, 16 is located at the next stage, a shift of 1 mV will be amplified to 16 mV.

SUMMARY OF THE INVENTION

The present invention was made under the background circumstances as described above. An object of the present invention is to provide a correlated double sampling circuit for reducing a shift in the potential of a node on the reference voltage side produced by reset operation and a CMOS image sensor including such a correlated double sampling circuit.

In order to achieve the above object, a correlated double sampling circuit for processing signals output from a pixel section where solid-state image sensing devices are arranged like a matrix is provided. This correlated double sampling circuit comprises a first capacitor for sampling and holding reset level signals corresponding to noise produced by resetting the pixel section, a second capacitor for sampling and holding detected signals obtained by a photoelectric conversion in the pixel section, a connection switch for sampling for controlling connection between predetermined power supply which generates predetermined potential to sample the detected signals with the predetermined potential as reference and the second capacitor, and a connection switch for reading for controlling reading of output signals according to a difference between the detected signals and the reset level signals obtained from electric charges sampled and held in the second capacitor and the first capacitor.

Furthermore, in order to achieve the above object, a CMOS image sensor comprising a pixel section where unit pixels including a photodiode and transistors are arranged like a matrix, a scanning circuit for scanning the pixels, and a correlated double sampling circuit for processing signals output from the pixel section are provided. The correlated double sampling circuit in this CMOS image sensor includes a first capacitor for sampling and holding reset level signals corresponding to noise produced by resetting the pixel section, a second capacitor for sampling and holding detected signals obtained by a photoelectric conversion in the pixel section, a connection switch for sampling for controlling connection between predetermined power supply which generates arbitrary potential to sample the detected signals with the arbitrary potential as reference and the second capacitor, and a connection switch for reading for controlling reading of output signals according to a difference between the detected signals and the reset level signals obtained from electric charges sampled and held in the second capacitor and the first capacitor.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
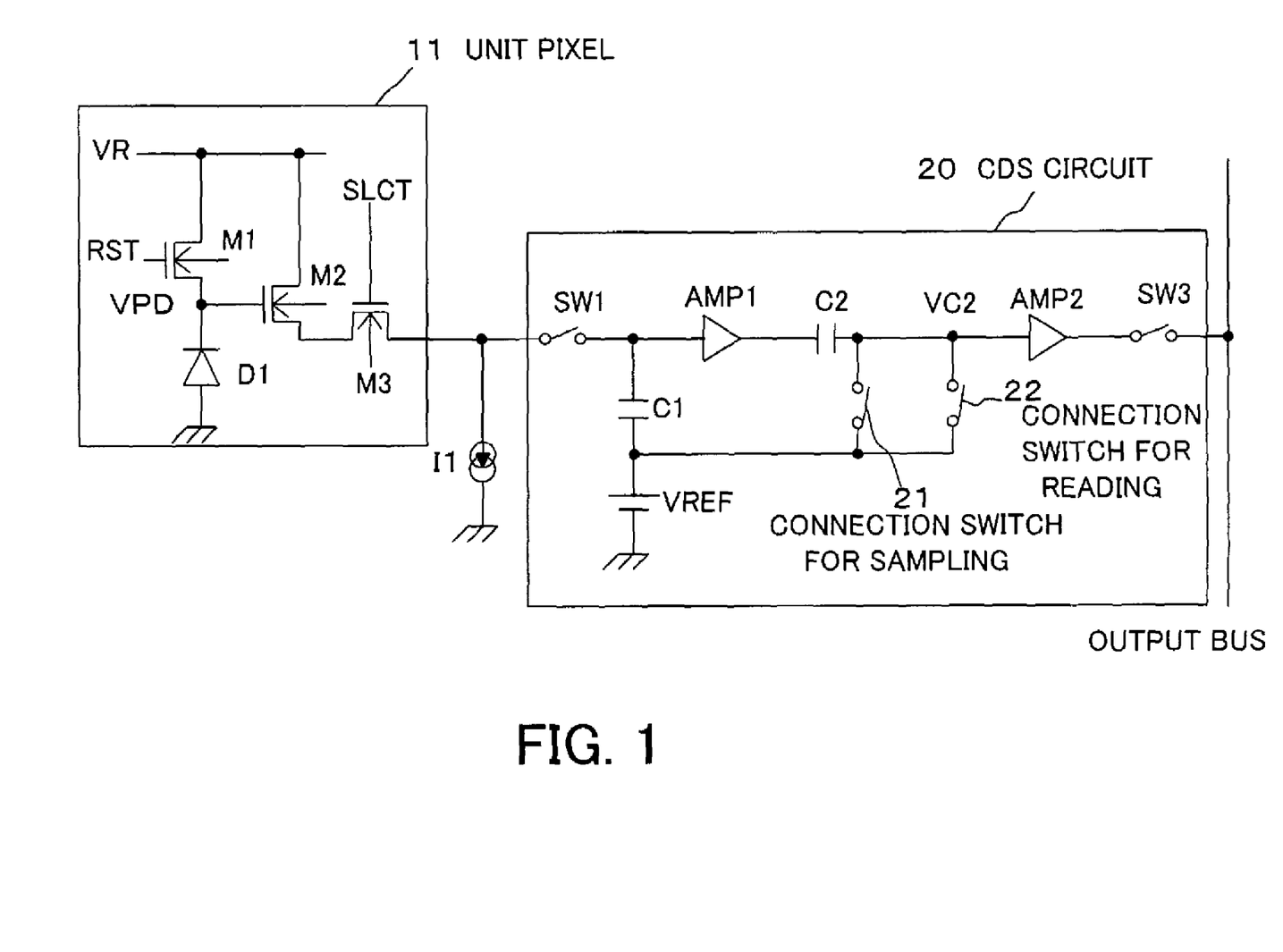
FIG. 1 is a circuit diagram of a CDS circuit according to an embodiment of the present invention.

FIG. 1 is a circuit diagram of a CDS circuit according to an embodiment of the present invention.

A CDS circuit 20 inputs signals output from a plurality of unit pixels 11 arranged in horizontal and vertical directions and processes them.

The unit pixel 11 includes a photodiode D1 and three n-channel MOS transistors M1 through M3. A cathode of the photodiode D1 is connected to a source of the transistor M1 and a gate of the transistor M2. A gate of the transistor M1, being a reset transistor, is connected to a reset line where a reset signal RST is supplied, and a drain of the transistor M1 is connected to a power supply line where reference voltage VR is supplied. A drain of the transistor M2, being a drive transistor, is connected to the power supply line where reference voltage VR is supplied. This is the same with the transistor M1. A source of the transistor M2 is connected to a drain of the transistor M3. A gate of the transistor M3, being a selection transistor, is connected to a column selection line where a selection signal SLCT is supplied. A source of the transistor M3 is connected to a current source I1 and a switch SW1 in the CDS circuit 20.

Now, operation in the unit pixel 11 will be described. When a reset signal RST turns to "H," the potential on the cathode side of the photodiode D1 becomes VR (constant). Subsequently, the reset signal RST turns to "L," then light strikes the photodiode D1. As a result, electric charges are produced in the photodiode D1 according to the intensity of light. These electric charges will change potential at VPD, that is to say, the voltage of the gate of the transistor M2. When a selection signal SLCT turns to "H," an electrical signal according to potential at VPD at that time is sent via the transistor M3 to the CDS circuit 20.

The CDS circuit 20 includes the connection switch for inputting SW1 for controlling input of signals output from the unit pixel 11, first and second capacitors C1 and C2 for sampling and holding signals output from the unit pixel 11, power supply VREF for generating reference potential Vref, a connection switch for sampling 21 for connecting the second capacitor C2 and the power supply VREF at sampling time, a connection switch for reading 22 for connecting the second capacitor C2 and the power supply VREF at reading time, amplifiers AMP1 and AMP2, and a connection switch for outputting SW3 for controlling output to an output bus in response to a signal from the horizontal scanning side.

The connection switch for inputting SW1 is connected to the current source I1, the source of the selection transistor M3 in the unit pixel 11, and one end of the first capacitor C1 in the CDS circuit 20 and imports signals detected by the unit pixel 11 into the CDS circuit 20.

One end of the first capacitor C1 is connected to an output terminal of the unit pixel 11 via the SW1 and to the amplifier AMP1 and the other end is connected to the power supply VREF and to one end of the second capacitor C2 via the connection switch for sampling 21. The first capacitor C1 samples and holds detected signals according to the intensity of light detected by the photodiode D1 which are output from the unit pixel 11 after the initial reset, and samples and holds reset level signals corresponding to noise produced by a reset when a second reset is performed.

One end of the second capacitor C2 is connected to the amplifier AMP1 and the other end is connected to the amplifier AMP2 and to the power supply VREF and first capacitor C1 via the connection switch for sampling 21 and connection switch for reading 22. When the initial reset is performed, the second capacitor C2 connects via the connection switch for sampling 21 with the power supply VREF and first capacitor C1 and samples and holds detected signals output from the unit pixel 11. When a second reset is performed, potential at node VC2 is given by equation (1). Then the connection switch for reading 22 and connection switch for outputting SW3 turn to ON and output signals according to potential at node VC2 are transferred.

Figure 8A:
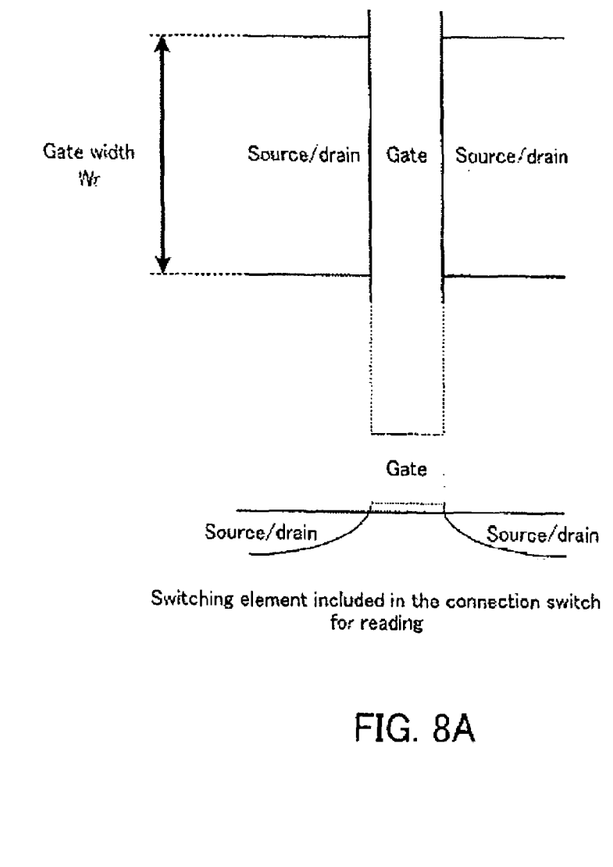
FIGS. 8A and 8B show switching elements included in the connection switch for reading and sampling, respectively.
Figure 8B:
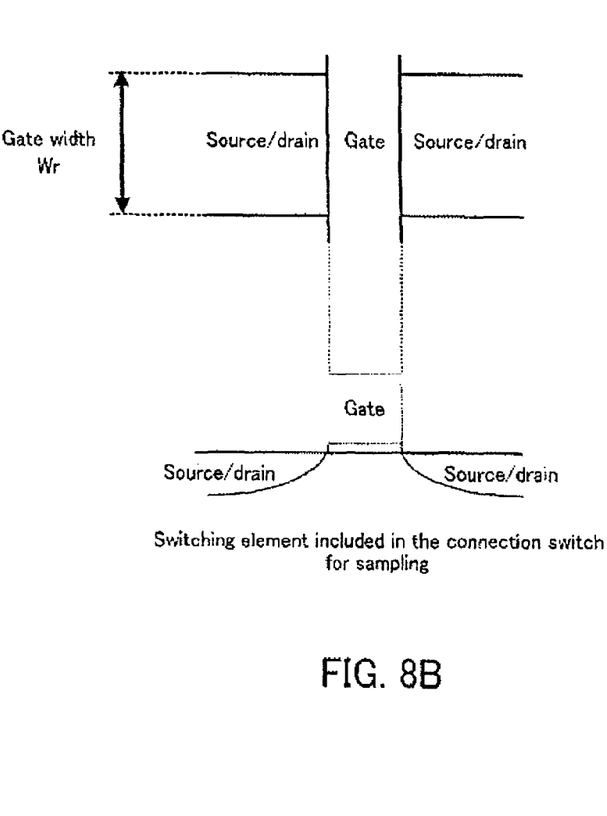

One end of the connect ion switch for sampling 21 is connected to one end of the second capacitor C2 and the other end of the connection switch for sampling 21 is connected to one end of the first capacitor C1 and the power supply VREF. At sampling time the connection switch for sampling 21 turns to ON to connect the second capacitor C2 to the first capacitor C1 and power supply VREF. When sampling ends the connection switch for sampling 21 turns to OFF to disconnect the second capacitor C2 from the first capacitor C1 and power supply VREF. As will be described later there is sufficient time to sample. Therefore, compared with the width of a gate of the connection switch for reading 22, the width of a gate of the connection switch for sampling 21 can be narrowed, as shown in FIGS. 8A and 8B, respectively. For example, the minimum width that can be realized by a technology used in the semiconductor production process may be selected. As a result, hold operation can be completed without being significantly influenced by parasitic capacitance between the gate and source and between the gate and drain.

One end of the connection switch for reading 22 is connected to one end of the second capacitor C2 and the other end of the connection switch for reading 22 is connected to one end of the first capacitor C1 and the power supply VREF. Together with the connection switch for outputting SW3, the connection switch for reading 22 turns to ON/OFF to transfer output signals according to the potential of node VC2. A pixel section 10 has become minute, so a read rate must be increased. Therefore, the width of a gate of the connection switch for reading 22 must be widened.

The connection switch for outputting SW3 turns to ON in synchronization with a horizontal scanning signal to transfer only signal components which the CDS circuit 20 generates by removing noise from signals detected by the unit pixel 11 to an output bus line.

Figure 2:
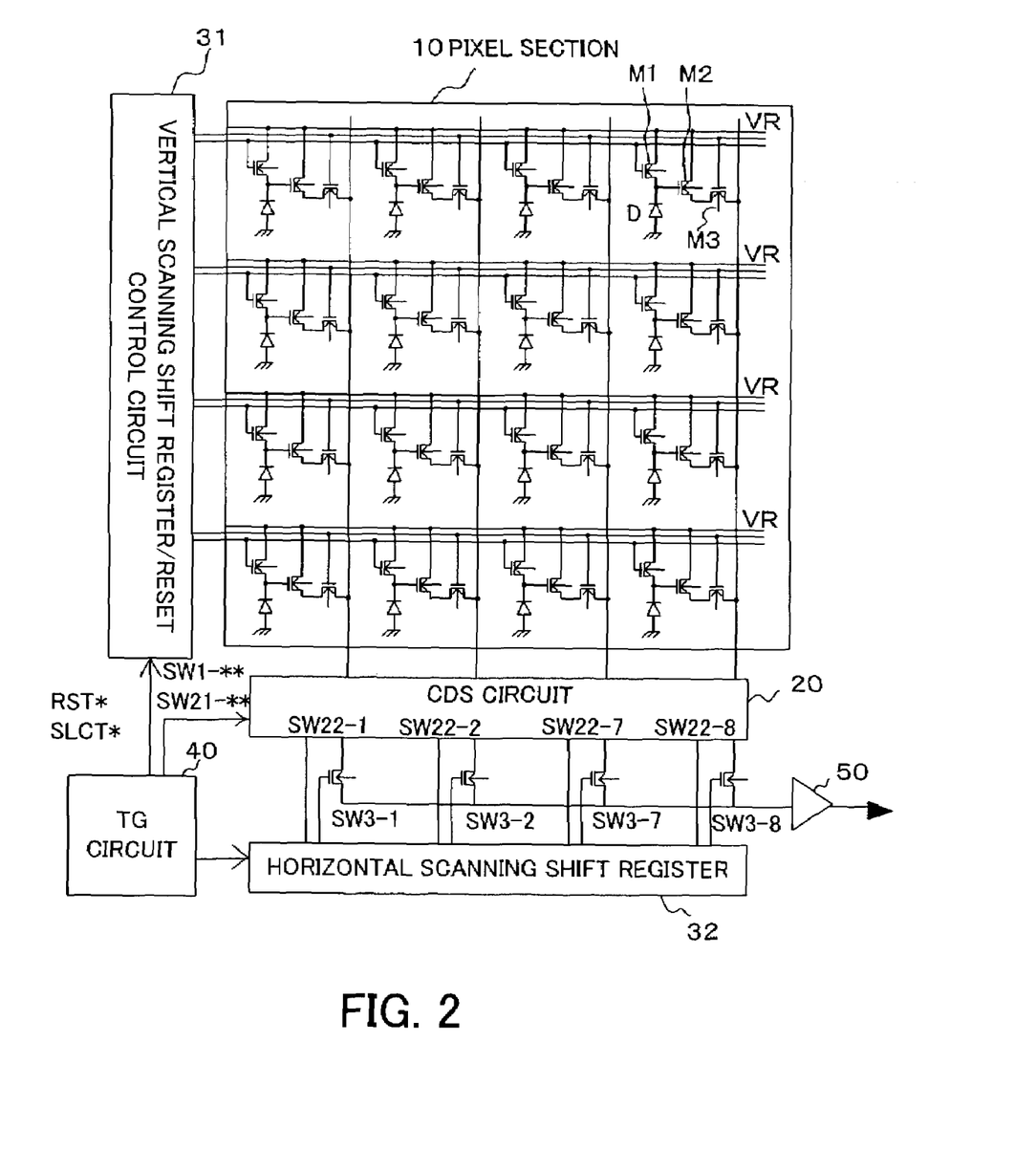
FIG. 2 is a view showing the basic structure of a CMOS image sensor.

The CDS circuit 20 described above is incorporated into a CMOS image sensor. FIG. 2 is a view showing the basic structure of a CMOS image sensor. Sections which are the same as those in FIG. 1 are denoted with the same numbers and descriptions of them will be omitted.

A CMOS image sensor comprises a pixel section 10 where unit pixels 11 are arranged like a matrix, a CDS circuit 20 for processing signals output from the pixel section 10, a scanning circuit including a vertical scanning shift register/reset control circuit 31 for scanning the pixel section 10 in a vertical direction and for controlling reset signals and a horizontal scanning shift register 32 for controlling horizontal scanning, and a timing generation circuit (TG circuit) 40 for generating timing signals for scanning and sampling.

The TG circuit 40 generates a selection signal SLCT* for selecting a row in a pixel section 10, a reset signal RST*, and a control signal for controlling switches SW1- and SW21- which connect the pixel section 10 and CDS circuit 20, where "*" indicates an arbitrary row and "**" indicates an arbitrary row and column.

The CDS circuit 20 is located for each column. The CDS circuit 20 outputs in order signals detected by the unit pixel 11 in a row selected by the vertical scanning shift register/reset control circuit 31 in compliance with a horizontal scanning signal output from the horizontal scanning shift register 32.

An amplifier 50 amplifies signals, which are output from the CDS circuit 20 and which are transferred to an output bus line, and transfers them to the next circuit.

Figure 3:
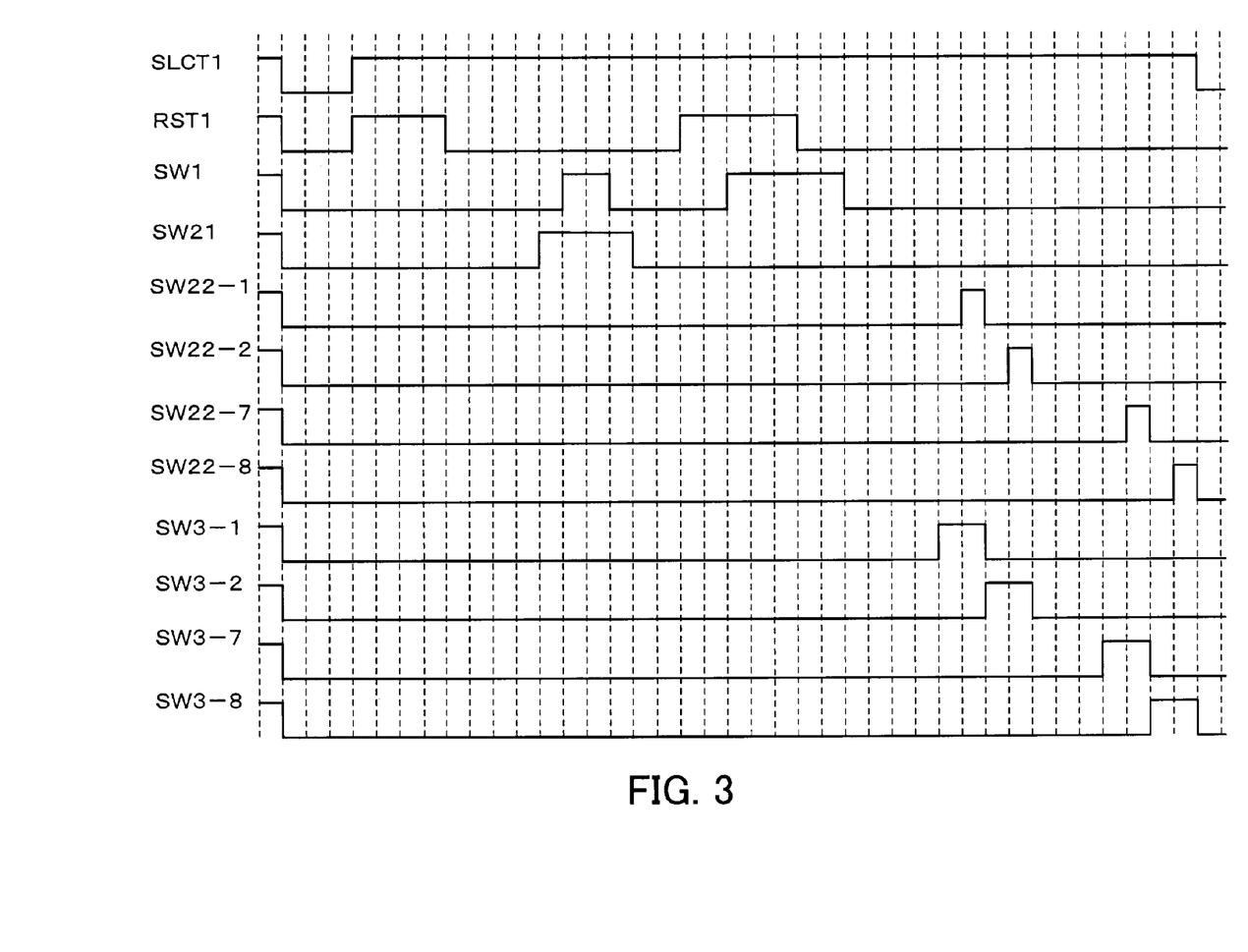
FIG. 3 is a timing chart of a CDS circuit section in a CMOS image sensor according to an embodiment of the present invention.

Now, operation in a CDS circuit having the above structure and a CMOS image sensor having the above structure will be described. FIG. 3 is a timing chart of a CDS circuit section in a CMOS image sensor according to an embodiment of the present invention.

A selection signal SLCT is turned to ON, and a row in the pixel section 10 is selected by the vertical scanning shift register/reset control circuit 31. In FIG. 3, SLCT1 is turned to ON and row 1 is selected. The moment or after SLCT1 is selected, an RST terminal is turned to ON and RST1 changes to "H." As a result, the potential of a cathode of a photodiode D1 is reset to initial potential VR. After reset time ends, the RST terminal is turned to OFF and RST1 changes to "L." When RST1 changes to "L," the photodiode D1 begins integration according to the intensity of light.

Then a connection switch for inputting SW1 and a connection switch for sampling 21 (SW21) in the CDS circuit 20 are turned to ON to accumulate detected signals according to integration time in a first capacitor C1 as electric charges. At this time electric charges are also accumulated in a second capacitor C2. After a certain period of time elapsed, the SW1 and connection switch for sampling 21 (SW21) are turned to OFF to hold the detected signals sampled. The width of a gate of the connection switch for sampling 21 is narrow, so this hold operation will be completed without being significantly influenced by parasitic capacitance between the gate and a source and between the gate and a drain. A connection switch for reading 22 (SW22-1 through SW22-8) is kept in the OFF state during this time.

Next, to accumulate reset noise in the first capacitor C1, the RST terminal is turned again to ON and the SW1 is turned to ON. After a certain period of time elapsed, the RST terminal is turned to OFF and the SW1 is also turned to OFF. As a result of this operation electric charges corresponding to the reset noise are accumulated in the first capacitor C1. Therefore, as shown by equation (1), the potential at a node of the second capacitor C2 is given by (Vref−detected signal) and only signal components can be extracted.

Then signals are transferred to the output bus line by turning a connection switch for outputting SW3 (SW3-1 through SW3-8) and the connection switch for reading 22 (SW22-1 through SW22-8) to ON in order in synchronization with a horizontal scanning signal.

As stated above, by locating the connection switch for sampling 21 for connecting the second capacitor C2 and power supply VREF in the case of performing sampling and by narrowing the width of its gate, fluctuations in the potential of a node on the reference voltage side can be reduced. By performing a process by the use of signals in which fluctuations in reference voltage are reduced in this way, a difference in brightness can be made small among output images.

Moreover, the connection switch for reading 22 is located separately from the connection switch for sampling 21. As a result, the width of a gate of the connection switch for reading 22 can be widened with an increase in read rate.

Figure 4:
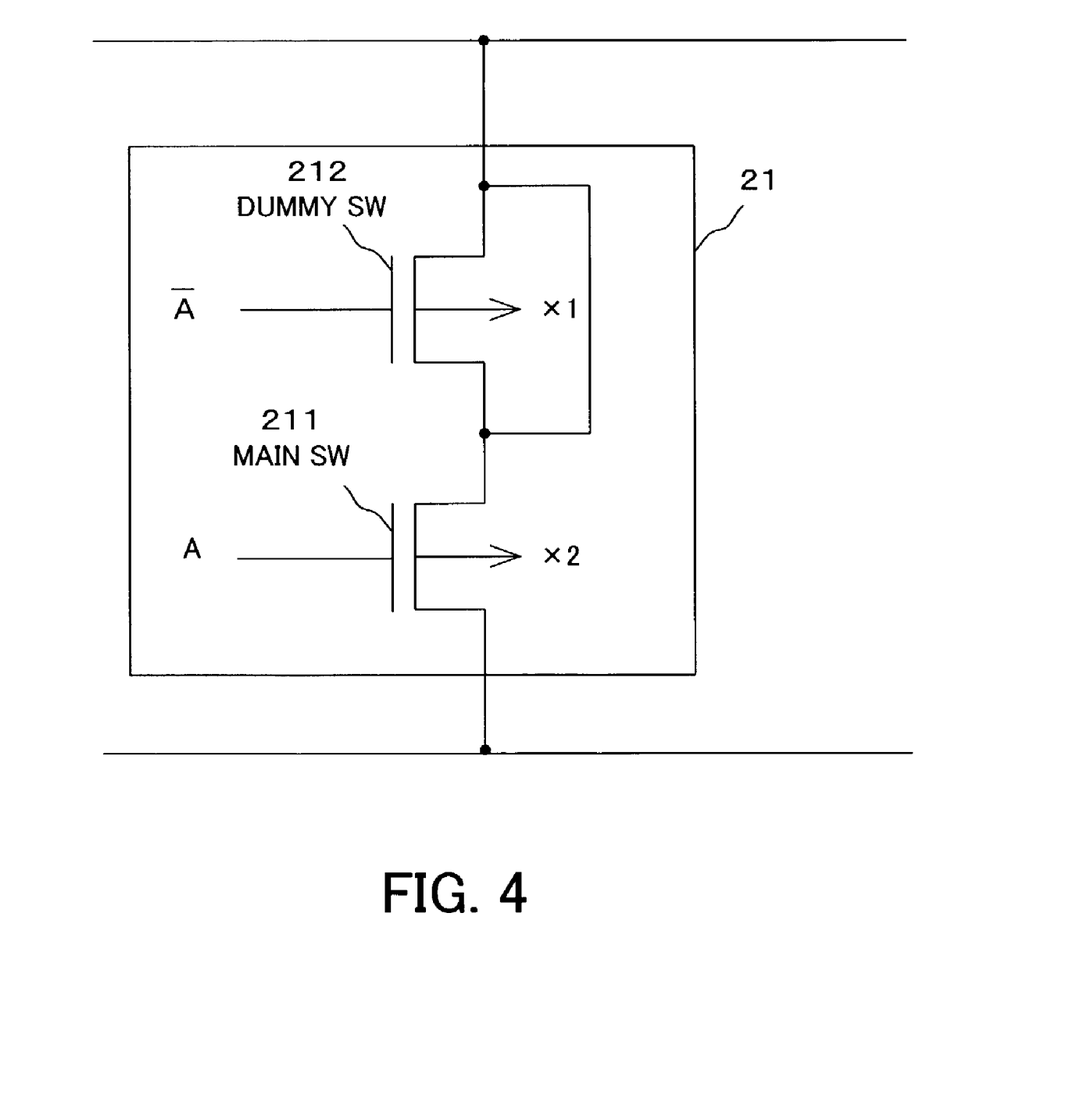
FIG. 4 is a view showing the structure of a connection switch for sampling according to the present invention.

Furthermore, the connection switch for sampling 21 described above consists of a proper switching element. However, an additional dummy switching element can be connected. FIG. 4 is a view showing the structure of a connection switch for sampling according to the present invention. Sections which are the same as those in FIG. 1 are denoted with the same numbers and descriptions of them will be omitted.

A drain and source of a main switching element (main SW) 211 are connected to power supply VREF and a drain of a dummy switching element (dummy SW) 212 respectively. A gate of the main SW211 is connected to a control signal for controlling ON/OFF of the main SW211 and dummy SW212.

A source of the dummy switching element 212 is connected to one end of a second capacitor C2 and its drain. The drain of the dummy switching element 212 is connected to the source of the main SW211. A gate of the dummy SW212 is connected to a signal obtained by inverting a control signal for controlling ON/OFF of the main SW211.

As has been described in the foregoing, a CDS circuit according to the present invention includes a capacitor for holding electric charges sampled with arbitrary potential as reference and a connection switch for sampling for sampling and holding signals detected by a pixel section and a connection switch for reading for reading output signals as switching elements for connecting or disconnecting power supply for generating the arbitrary potential. This reduces fluctuations in the potential of a node on the reference voltage side caused by turning a switch to OFF at the time of sampling being ended.

With a CMOS image sensor including such a CDS circuit according to the present invention, output signals in which fluctuations in reference voltage are small in the case of extracting signals detected by the pixel section can be obtained by the CDS circuit. As a result, good output images among which a difference in brightness is small can be obtained.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A correlated double sampling circuit for processing signals output from a pixel section where solid-state image sensing devices are arranged like a matrix, the circuit comprising:

a first capacitor for sampling and holding reset level signals corresponding to noise produced by resetting the pixel section;

a second capacitor for sampling and holding detected signals obtained by a photoelectric conversion in the pixel section;

a connection switch for sampling for controlling connection between predetermined power supply which generates predetermined potential to sample the detected signals with the predetermined potential as reference and the second capacitor; and a connection switch for reading for controlling reading of output signals according to a difference between the detected signals and the reset level signals obtained from electric charges sampled and held in the second capacitor and the first capacitor, wherein a width of a gate of a switching element included in the connection switch for sampling is narrower than a width of a gate of a switching element included in the connection switch for reading.

2. The correlated double sampling circuit according to claim 1, wherein a width of a gate of a switching element included in the connection switch for sampling is a minimum width formed in a semiconductor production process.

3. A correlated double sampling circuit for processing signals output from a pixel section where solid-state image sensing devices are arranged like a matrix, the circuit comprising:
- a first capacitor for sampling and holding reset level signals corresponding to noise produced by resetting the pixel section;
- a second capacitor for sampling and holding detected signals obtained by a photoelectric conversion in the pixel section;
- a connection switch for sampling for controlling connection between predetermined power supply which generates predetermined potential to sampling the detected signals with the predetermined potential as reference and the second capacitor; and
- a connection switch for reading for controlling reading of output signals according to a difference between the detected signals and the reset level signals obtained from electric charges sampled and held in the second capacitor and the first capacitor,
- wherein a switching element included in the connection switch for sampling is connected to a dummy switching element, a gate of the dummy switching element being provided with a signal with a phase reverse to a phase of an input signal provided to a gate of the switching element included in the connection switch for sampling and a source and drain of the dummy switching element being connected to each other.

4. A correlated double sampling circuit for processing signals output from a pixel section where solid-state sensing devices are arranged like a matrix, the circuit comprising:
- a first capacitor for sampling and holding reset level signals corresponding to noise produced by resetting the pixel section, a first terminal of the first capacitor being connected to an output terminal of the pixel section at sampling time, and a second terminal of the first capacitor being connected to predetermined power supply for generating predetermined reference potential for sampling; and
- a second capacitor connected in parallel with the first capacitor and connected via a connection switch for sampling and a connection switch for reading located in parallel with the connection switch for sampling to the second terminal of the first capacitor and the predetermined power supply for sampling and holding detected signals obtained by a photoelectric conversion in the pixel section, wherein:
- the connection switch for sampling connects the second capacitor to the first capacitor and the predetermined power supply while the second capacitor samples the detected signals; and
- the connection switch for reading connects the second capacitor to the first capacitor and the predetermined power supply while output signals according to a difference between the detected signals and the reset level signals obtained from electric charges sampled and held in the second capacitor and the first capacitor are read.

5. The correlated double sampling circuit according to claim 4, wherein a width of a gate of a switching element included in the connection switch for sampling is narrower than a width of a gate of a switching element included in the connection switch for reading.

6. The correlated double sampling circuit according to claim 4, wherein a width of a gate of a switching element included in the connection switch for sampling is a minimum width formed in a semiconductor production process.

7. The correlated double sampling circuit according to claim 4, wherein a switching element included in the connection switch for sampling is connected to a dummy switching element, a gate of the dummy switching element being provided with a signal with a phase reverse to a phase of an input signal provided to a gate of the switching element included in the connection switch for sampling and a source and drain of the dummy switching element being connected to each other.

8. A CMOS image sensor comprising:
- a pixel section where unit pixels including a photodiode and transistors are arranged like a matrix;
- a scanning circuit for scanning the pixels; and
- a correlated double sampling circuit for processing signals output from the pixel section, the circuit including:
- a first capacitor for sampling and holding reset level signals corresponding to noise produced by resetting the pixel section, a first terminal of the first capacitor being connected to an output terminal of the pixel section at sampling time, and a second terminal of the first capacitor being connected to predetermined power supply for generating predetermined reference potential for sampling; and
- a second capacitor connected in parallel with the first capacitor and connected via a connection switch for sampling and a connection switch for reading located in parallel with the connection switch for sampling to the second terminal of the first capacitor and the predetermined power supply for sampling and holding detected signals obtained by a photoelectric conversion in the pixel section, wherein:
- the connection switch for sampling connects the second capacitor to the first capacitor and the predetermined power supply while the second capacitor samples the detected signals; and
- the connection switch for reading connects the second capacitor to the first capacitor and the predetermined power supply while output signals according to a difference between the detected signals and the reset level signals obtained from electric charges sampled and held in the second capacitor and the first capacitor are read.

* * * * *